US011591692B2

(12) United States Patent
Lei et al.

(10) Patent No.: US 11,591,692 B2
(45) Date of Patent: Feb. 28, 2023

(54) ORGANOAMINO-POLYSILOXANES FOR DEPOSITION OF SILICON-CONTAINING FILMS

(71) Applicant: Versum Materials US, LLC, Tempe, AZ (US)

(72) Inventors: Xinjian Lei, Vista, CA (US); Manchao Xiao, San Diego, CA (US); Matthew R. MacDonald, Laguna Niguel, CA (US); Daniel P. Spence, Carlsbad, CA (US); Meiliang Wang, San Marcos, CA (US); Suresh Kalpatu Rajaraman, San Marcos, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 15/884,013

(22) Filed: Jan. 30, 2018

(65) Prior Publication Data

US 2018/0223428 A1   Aug. 9, 2018

Related U.S. Application Data

(60) Provisional application No. 62/456,311, filed on Feb. 8, 2017, provisional application No. 62/472,313, filed on Mar. 16, 2017.

(51) Int. Cl.

| | | |
|---|---|---|
| *C23C 16/455* | (2006.01) | |
| *C08K 5/5415* | (2006.01) | |
| *C08L 83/08* | (2006.01) | |
| *C08G 77/54* | (2006.01) | |
| *C07F 7/10* | (2006.01) | |
| *C09D 183/08* | (2006.01) | |
| *C08G 77/26* | (2006.01) | |
| *C08G 77/04* | (2006.01) | |

(52) U.S. Cl.
CPC .......... *C23C 16/45536* (2013.01); *C07F 7/10* (2013.01); *C08G 77/54* (2013.01); *C08K 5/5415* (2013.01); *C08L 83/08* (2013.01); *C09D 183/08* (2013.01); *C23C 16/45553* (2013.01); *C08G 77/045* (2013.01); *C08G 77/26* (2013.01)

(58) Field of Classification Search
CPC .... C23C 16/45536; C08G 77/26; C08L 83/08
See application file for complete search history.

(56) References Cited

U.S. PATENT DOCUMENTS

| | | | | |
|---|---|---|---|---|
| 3,530,092 | A | * | 9/1970 | Borchert ................... C07F 7/10 |
| | | | | 528/15 |
| 3,530,392 | A | | 9/1970 | Borchert |
| 3,700,712 | A | * | 10/1972 | Ostrozynski .......... C07F 7/0894 |
| | | | | 556/449 |
| 7,084,076 | B2 | | 8/2006 | Park et al. |
| 8,912,353 | B2 | | 12/2014 | Xiao et al. |
| 8,940,648 | B2 | | 1/2015 | Xiao et al. |
| 9,005,719 | B2 | | 4/2015 | Xiao et al. |
| 9,245,740 | B2 | | 1/2016 | Jang et al. |
| 9,337,018 | B2 | | 5/2016 | Xiao et al. |
| 2014/0127523 | A1 | * | 5/2014 | Delis ..................... B27K 3/153 |
| | | | | 428/541 |
| 2015/0087139 | A1 | | 3/2015 | O'Neill et al. |
| 2015/0275355 | A1 | | 10/2015 | Mallikarjunan et al. |
| 2015/0376211 | A1 | | 12/2015 | Girard et al. |
| 2016/0083847 | A1 | | 3/2016 | Spence et al. |

FOREIGN PATENT DOCUMENTS

| | | |
|---|---|---|
| WO | 9518096 A1 | 7/1995 |
| WO | 03093352 A1 | 11/2003 |
| WO | 2015105337 A1 | 7/2015 |

OTHER PUBLICATIONS

Alejandro, Julien, et al. "Solvent-Free Iridium-Catalyzed Reactivity of CO2 with Secondary Amines and Hydrosilanes," CHEMCATCHEM, vol. 7, No. 23, Dec. 1, 2015 (Dec. 1, 2015), pp. 3895-3902.
Bogdan, Marciniec, et al. "Ruthenium-catalyzed dealkenative N-silylation of amines by substituted vinylsilanes." Dalton Transactions, vol. 44, No. 2, Jan. 1, 2015 (Jan. 1, 2015), pp. 782-786.
European Patent Office, Extended Search Report, dated Oct. 20, 2016, Appln No. 18751016.9-1109 / 3580370; PCT/US2018017050.

* cited by examiner

*Primary Examiner* — Kuo Liang Peng
(74) *Attorney, Agent, or Firm* — David K. Benson

(57) ABSTRACT

Organoamino-polysiloxanes, which have at least three silicon atoms, oxygen atoms, as well as an organoamino group, and methods for making the organoamino-polysiloxanes are disclosed. Methods for depositing silicon and oxygen containing films using the organoamino-polysiloxanes are also disclosed.

6 Claims, No Drawings

ORGANOAMINO-POLYSILOXANES FOR DEPOSITION OF SILICON-CONTAINING FILMS

CROSS REFERENCE TO RELATED APPLICATIONS

This application claims the benefit of priority under 35 U.S.C. § 119(e) of U.S. Provisional Application Ser. No. 62/456,311 filed Feb. 8, 2017 and Provisional Application Ser. No. 62/472,313 filed Mar. 16, 2017, the entireties of which are incorporated herein by reference.

BACKGROUND

The disclosure relates to organosilicon compounds which can be used to deposit silicon and oxygen containing films (e.g., silicon oxide, silicon oxycarbonitride, silicon oxycarbide, carbon-doped silicon oxide, among other silicon and oxygen containing films), methods for using the compounds for depositing silicon oxide containing films as well as films obtained from the compounds and methods.

Described herein are novel organoamino-polysiloxane compounds and compositions and methods comprising same to deposit a silicon-containing film such as, without limitation, silicon oxide, silicon oxynitride, silicon oxycarbonitride, and carbon-doped silicon oxide via a thermal atomic layer deposition (ALD) or plasma enhanced atomic layer deposition (PEALD) process, or a combination thereof. More specifically, described herein is a composition and method for formation of a stoichiometric or a non-stoichiometric silicon-containing film or material at one or more deposition temperatures of about 600° C. or less including, for example, from about 25° C. to about 300° C.

Atomic Layer Deposition (ALD) and Plasma Enhanced Atomic Layer Deposition (PEALD) are processes used to deposit, for example, silicon oxide conformal films at low temperature (<500° C.). In both ALD and PEALD processes, the precursor and reactive gas (such as oxygen or ozone) are separately pulsed in a certain number of cycles to form a monolayer of silicon oxide at each cycle. However, silicon oxide deposited at low temperatures using these processes may contain levels of impurities such as, without limitation, carbon (C) or hydrogen (H), which may be detrimental in certain semiconductor applications. To remedy this, one possible solution is to increase the deposition temperature to 500° C. or greater. However, at these higher temperatures, conventional precursors employed by semiconductor industries tend to self-react, thermally decompose, and deposit in a chemical vapor deposition (CVD) mode rather than an ALD mode. The CVD mode deposition has reduced conformality compared to ALD deposition, especially for high aspect ratio structures which are needed in many semiconductor applications. In addition, the CVD mode deposition has less control of film or material thickness than the ALD mode deposition.

Organoaminosilane and chlorosilane precursors are known in the art that can be used to deposit silicon-containing films via Atomic Layer Deposition (ALD) and Plasma Enhanced Atomic Layer Deposition (PEALD) processes at a relatively low-temperature (<300° C.) and with relatively high Growth Per Cycle (GPC, >1.5 Å/cycle).

Examples of known precursors and methods are disclosed in the following publications, patents, and patent applications.

U.S. Pat. No. 7,084,076 describes the use of a halogen- or NCO-substituted disiloxane precursor to deposit a silicon oxide film using in a base-catalyzed ALD process.

U.S. Pub. No. 2015/0087139 describes the use of amino-functionalized carbosilanes to deposit silicon containing films via thermal ALD or PEALD processes.

U.S. Pat. No. 9,337,018 describes the use of organoaminodisilanes to deposit silicon containing films via thermal ALD or PEALD processes.

U.S. Pat. Nos. 8,940,648, 9,005,719, and 8,912,353 describe the use of organoaminosilanes to deposit silicon containing films via thermal ALD or PEALD processes.

U.S. Pub. No. 2015/0275355 describes the use of mono- and bis(organoamino)alkylsilanes to deposit silicon containing films via thermal ALD or PEALD processes.

U.S. Pub. No. 2015/0376211 describes the use of mono (organoamino)-, halido-, and pseudohalido-substituted trisilylamines to deposit silicon containing films via thermal ALD or PEALD processes.

Pub. No. WO 2015/0105337 and U.S. Pat. No. 9,245,740 describe the use of alkylated trisilylamines to deposit silicon containing films via thermal ALD or PEALD processes.

U.S. Pat. No. 7,084,076 describes the use of a halogen- or NCO-substituted disiloxane precursor to deposit a silicon oxide film using in a base-catalyzed ALD process.

The disclosure of the previously identified patents and patent applications is hereby incorporated by reference.

There is a need in this art for precursors and methods for depositing silicon and oxygen containing films at high growth per cycle (GPC) in order to maximize throughput in a semiconductor manufacturing facility. Although certain precursors are capable of deposition at >1.5 Å/cycle GPC, these precursors have disadvantages such as low-quality film (elemental contamination, low-density, poor electrical properties, high wet etch rate), high process temperatures, requires a catalyst, are expensive, produce low conformality films, among other disadvantages.

SUMMARY

The present disclosure solves problems associated with conventional precursors and processes by providing silicon- and oxygen-containing precursors, specifically organo-amino-polysiloxanes, which have at least three silicon atoms, oxygen atoms, as well as an organoamino group that serves to anchor the polysiloxane unit to the surface of a substrate as part of a process to deposit a silicon and oxygen containing film. The precursors having three or more silicon atoms, and at least two or more Si—O—Si linkages disclosed in this invention have novel structures compared to those described in the Background of the Invention and, therefore, may provide an advantage in one or more aspects with respect to either cost or convenience of precursor synthesis, physical properties of the precursor including thermal stability, reactivity or volatility, the process of depositing a silicon-containing film, or the properties of the deposited silicon-containing film.

In an embodiment, there is disclosed a composition comprising at least one organoamino-polysiloxane compound selected from the group consisting of Formulae A, B, C, D, E, F, G, and H:

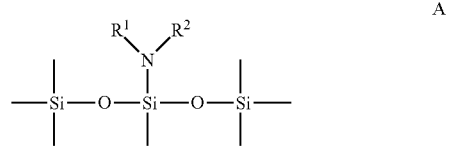

A

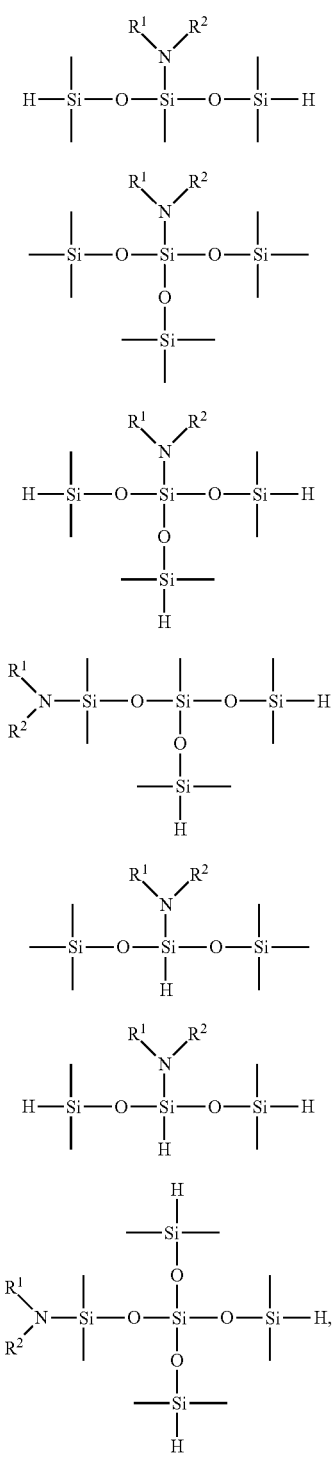
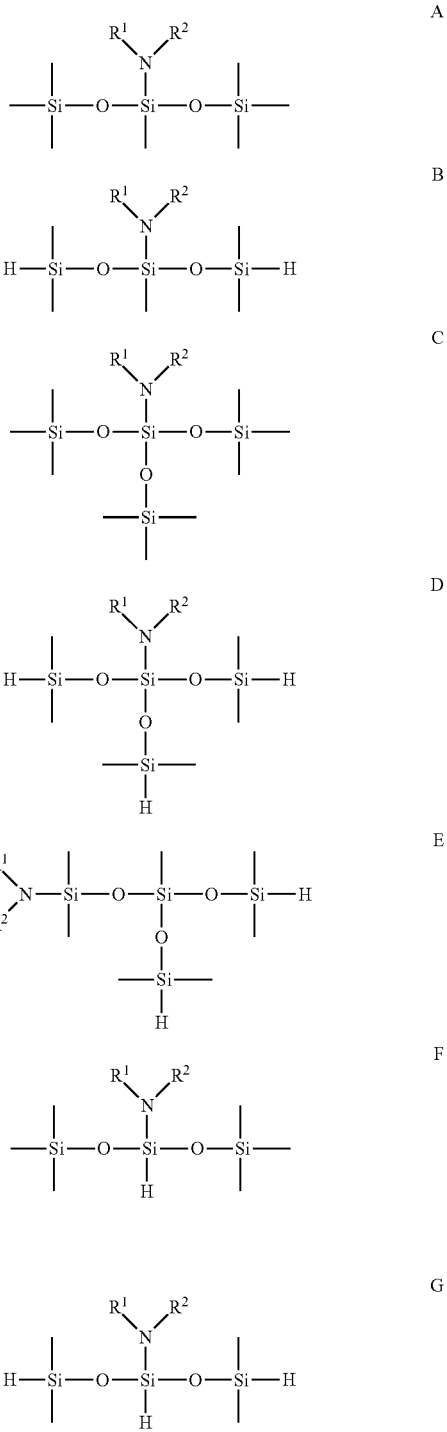

Formulae A-H are either linked to form a cyclic ring structure or are not linked to form a cyclic ring structure.

In another aspect there is provided a method for depositing a film comprising silicon and oxide onto a substrate, the method comprising the steps of: a) providing a substrate in a reactor; b) introducing into the reactor a composition comprising at least one organoamino-polysiloxane compound selected from the group consisting of Formulae A, B, C, D, E, F, G, and H:

wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in

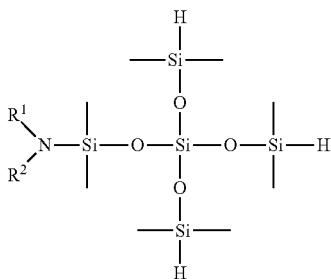

wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formulae A-H are either linked to form a cyclic ring structure or are not linked to form a cyclic ring; c) purging the reactor with a purge gas; d) introducing at least one of an oxygen-containing source and a nitrogen-containing source into the reactor; and e) purging the reactor with the purge gas, wherein the steps b through e are repeated until a desired thickness of film is deposited; and wherein the method is conducted at one or more temperatures ranging from about 25° C. to 600° C.

In another aspect there is disclosed a method of preparing an organoamino-polysiloxane compound having a structure represented by Formulae A to H:

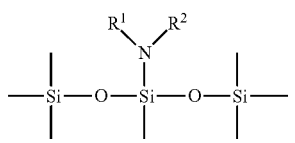

A

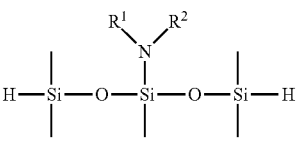

B

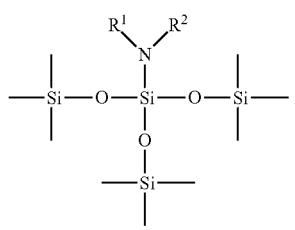

C

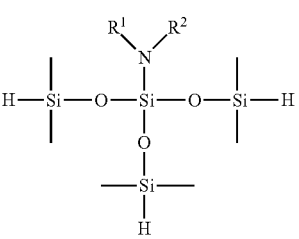

D

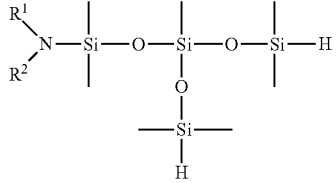

E

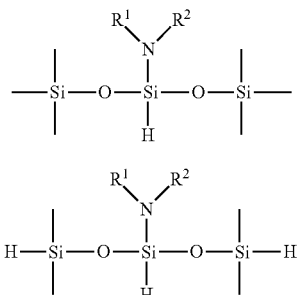

F

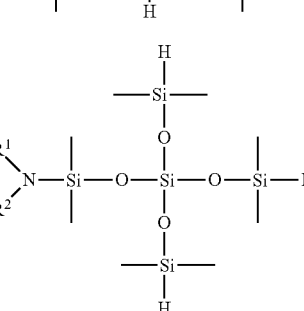

G

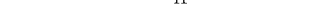

H wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formulae A-H are either linked to form a cyclic ring structure or are not linked to form a cyclic ring, wherein the method comprises the steps of: a) contacting the reactants $R^1R^2NH$ and a polysiloxane having at least one Si—H group in the presence of a catalyst, thus forming a reaction mixture, wherein $R^1$ and $R^2$ are as defined above; b) optionally adding a solvent to the reaction mixture; c) maintaining the reaction mixture at a temperature between about zero ° C. to about 300° C.; and d) allowing the reaction to proceed to form the organoamino-polysiloxane compound from the reaction mixture.

The process for depositing a stoichiometric or nonstoichiometric silicon and oxygen containing material or film, such as without limitation, a silicon oxide, a carbon doped silicon oxide, a silicon oxynitride film, or a carbon doped silicon oxynitride film at relatively low temperatures, e.g., at one or more temperatures of 600° C. or lower, may be a plasma enhanced ALD (PEALD), plasma enhanced cyclic chemical vapor deposition (PECCVD), a flowable chemical vapor deposition (FCVD), a plasma enhanced flowable chemical vapor deposition (PEFCVD), a plasma enhanced ALD-like process, or an ALD process with oxygen-containing reactant source, a nitrogen-containing reactant source, or a combination thereof.

In some embodiments, an oxygen-containing source employed in the method is a source selected from the group consisting of an oxygen plasma, ozone, a water vapor, water vapor plasma, nitrogen oxide (e.g., $N_2O$, NO, $NO_2$) plasma with or without inert gas, a carbon oxide (e.g., $CO_2$, CO) plasma and combinations thereof. In certain embodiments, the oxygen source further comprises an inert gas. In these embodiments, the inert gas is selected from the group consisting of argon, helium, nitrogen, hydrogen, and combinations thereof. In an alternative embodiment, the oxygen source does not comprise an inert gas. In yet another embodiment, the oxygen-containing source comprises nitrogen which reacts with the reagents under plasma conditions to provide a silicon oxynitride film.

In some embodiments, a nitrogen-containing source may be introduced into the reactor in the form of at least one nitrogen-containing source and/or may be present incidentally in the other precursors used in the deposition process. Suitable nitrogen source gases may include, for example, ammonia, hydrazine, monoalkylhydrazine, dialkylhydrazine, nitrogen, nitrogen/hydrogen, nitrogen/argon plasma, nitrogen/helium plasma, ammonia plasma, nitrogen plasma, nitrogen/hydrogen plasma, organic amines such as tert-butylamine, dimethylamine, diethylamine, isopropylamine, diethylamine plasma, dimethylamine plasma, trimethyl plasma, trimethylamine plasma, ethylenediamine plasma, and an alkoxyamine such as ethanolamine plasma and mixture thereof. In certain embodiments, the nitrogen-containing source comprises an ammonia plasma, a plasma comprising nitrogen and argon, a plasma comprising nitrogen and helium or a plasma comprising hydrogen and nitrogen source gas.

In the embodiments described above and throughout this invention, the inert gas is selected from the group consisting of argon, helium, nitrogen, hydrogen, or combinations thereof. In an alternative embodiment, the oxygen-containing plasma source does not comprise an inert gas.

The embodiments of the invention can be used alone or in combinations with each other.

DETAILED DESCRIPTION

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Described herein are compositions and methods related to the formation of a stoichiometric or nonstoichiometric film or material comprising silicon and oxygen such as, without limitation, a silicon oxide, a carbon-doped silicon oxide film, a silicon oxynitride, or a carbon-doped silicon oxynitride film or combinations thereof with one or more temperatures, of about 600° C. or less, or from about 25° C. to about 600° C., and in some other embodiments, from about 550° C. to about 800° C. The films described herein are deposited in a deposition process such as an atomic layer deposition (ALD) or in an ALD-like process such as, without limitation, a plasma enhanced ALD (PEALD) or a plasma enhanced cyclic chemical vapor deposition process (PECCVD), a flowable chemical vapor deposition (FCVD), or a plasma enhanced flowable chemical vapor deposition (PEFCVD). The low temperature deposition (e.g., one or more deposition temperatures ranging from about ambient temperature to 600° C.) methods described herein provide films or materials that exhibit at least one or more of the following advantages: a density of about 2.1 g/cc or greater, low chemical impurity, high conformality in a thermal atomic layer deposition, a plasma enhanced atomic layer deposition (ALD) process or a plasma enhanced ALD-like process, an ability to adjust carbon content in the resulting film; and/or films have an etching rate of 5 Angstroms per second (Å/sec) or less when measured in 0.5 wt. % dilute HF. For carbon-doped silicon oxide films, greater than 1% carbon is desired to tune the etch rate to values below 2 Å/sec in 0.5 wt. % dilute HF in addition to other characteristics such as, without limitation, a density of about 1.8 g/cc or greater or about 2.0 g/cc or greater.

The present invention can be practiced using equipment known in the art. For example, the inventive method can use a reactor that is conventional in the semiconductor manufacturing art.

Without wishing to be bound by any theory or explanation, it is believed that the effectiveness of the inventive precursor can vary as a function of the number of silicon atoms and, in particular, the silicon atom bonds within the inventive precursors. The inventive precursors have three or more silicon atoms, and at least two or more Si—O—Si linkages. The Si—O—Si linkages can play an important role during formation of silicon and oxygen containing films.

The multi-silicon precursors proposed in this invention have different structures than known in this art and, therefore, are able to perform better than conventional silicon-containing precursors and provide relatively high growth per cycle (GPC), yielding a higher quality film, having a favorable wet etch rate, or having less elemental contaminations.

One embodiment of the invention relates to a composition for depositing a film selected from a silicon oxide, a carbon-doped silicon oxide, or a silicon carboxynitride film using a vapor deposition process, the composition comprising a compound having either Formula A, Formula B, Formula C, Formula D, Formula E, Formula F, Formula G, or Formula H:

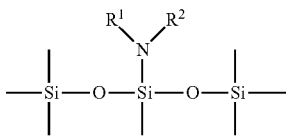

A

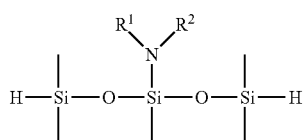

B

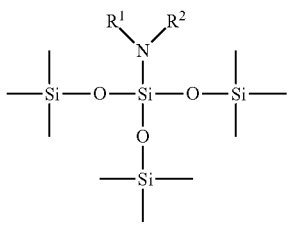

C

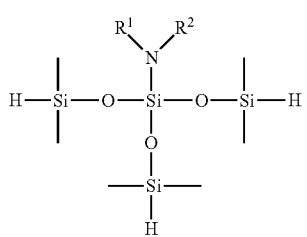

D

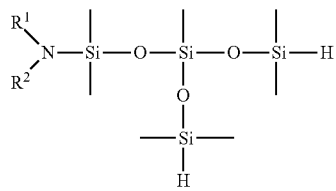

E

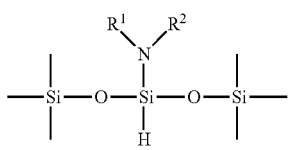

F

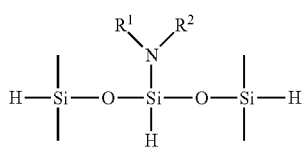

G

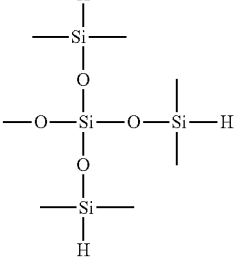

H wherein $R^1$ is independently selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formulae A-H are either linked to form a cyclic ring structure or are not linked to form a cyclic ring structure.

In certain embodiments of the composition described herein further comprises a solvent. Exemplary solvents can include, without limitation, ether, tertiary amine, alkyl hydrocarbon, aromatic hydrocarbon, siloxanes, tertiary aminoether, and combinations thereof. In certain embodiments, the difference between the boiling point of the silicon precursor and the boiling point of the solvent is 40° C. or less. The wt % of silicon precursor consisting of Formulae A-H in the solvent can vary from 1 to 99 wt %, or 10 to 90 wt %, or 20 to 80 wt %, or 30 to 70 wt %, or 40 to 60 wt %, to 50 to 50 wt %. In some embodiments, the composition can be delivered via direct liquid injection into a reactor chamber for silicon-containing film.

In the formulae above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl ($Pr^i$), iso-butyl ($Bu^i$), sec-butyl ($Bu^s$), tert-butyl ($Bu^t$), iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In the formulae above and throughout the description, the term "alkenyl group" denotes a group which has one or more carbon-carbon double bonds and has from 2 to 10 or from 2 to 6 carbon atoms.

In the formulae described herein and throughout the description, the term "dialkylamino" group, "alkylamino" group, or "organoamino" group denotes a group which has two alkyl groups bonded to a nitrogen atom or one alkyl bonded to a nitrogen atom and has from 1 to 10 or from 2 to 6 or from 2 to 4 carbon atoms. Examples include but not limited to HNMe, HNEt, HNPr$^i$, HNPr$^n$, HNBu$^s$, HNBu$^i$, HNBu$^t$, NMe$_2$, NMeEt, NEt$_2$, NPr$^i_2$, NBu$^s_2$. In some embodiments, the two alkyls are linked to form a ring such as pyrrolidino, 2,5-dimethylpyrrolidino, piperidino, 2,6-dimethylpiperidino.

In the formulae above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl.

Throughout the description, the term "alkyl hydrocarbon" refers a linear or branched C$_1$ to C$_{20}$ hydrocarbon, cyclic C$_6$ to C$_{20}$ hydrocarbon. Exemplary hydrocarbon includes, but not limited to, hexane, heptane, octane, nonane, decane, dodecane, cyclooctane, cyclononane, cyclodecane, ethylcyclohexane, ethylcyclooctane.

Throughout the description, the term "aromatic hydrocarbon" refers a C$_6$ to C$_{20}$ aromatic hydrocarbon. Exemplary aromatic hydrocarbon n includes, but not limited to, toluene, mesitylene In the formulae above and throughout the description, the term "heterocyclic" means a non-aromatic saturated monocyclic or multicyclic ring system of about 3 to about 10 ring atoms, preferably about 5 to about 10 ring atoms, in which one or more of the atoms in the ring system is/are element(s) other than carbon, for example nitrogen, oxygen or sulfur. Preferred heterocycles contain about 5 to about 6 ring atoms. The prefix aza, oxa or thia before heterocycle means that at least a nitrogen, oxygen or sulfur atom respectively is present as a ring atom. The heterocyclic group is optionally substituted.

Table 1a provides exemplary organoamino-polysiloxanes having Formulae A-H wherein R$^1$ and R$^2$ are independently selected from a C$_1$ to C$_4$ alkyl group.

TABLE 1a

Exemplary organoamino-polysiloxanes having Formulae A-H

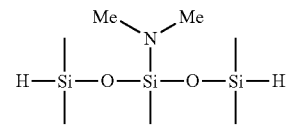

3-dimethylamino-1,1,1,3,5,5,5-heptamethyltrisiloxane

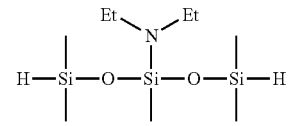

3-diethylamino-1,1,1,3,5,5,5-heptamethyltrisiloxane

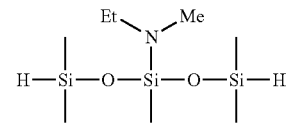

3-ethylmethylarrfno-1,1,1,3,5,5,5-heptamethyltrisiloxane

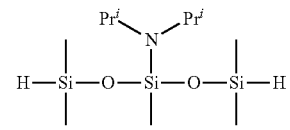

3-di-iso-propylamino-1,1,1,3,5,5,5-heptamethyltrisiloxane

TABLE 1a-continued

Exemplary organoamino-polysiloxanes having Formulae A-H

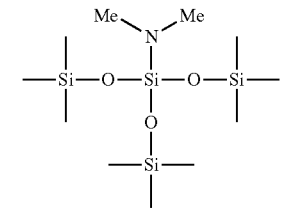

3-dimethylamino-1,1,3,5,5-pentamethyltrisiloxane 3-diethylamino-1,1,3,5,5-pentamethyltrisiloxane 3-ethylmethylamino-1,1,3,5,5-pentamethyltrisiloxane 3-di-iso-propylamino-1,1,3,5,5-pentamethyltrisiloxane

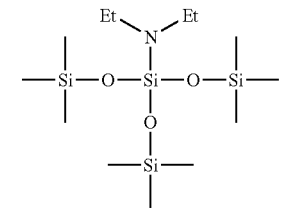

3-dimethylamino-3-(trimethylsiloxy)-1,1,1,5,5,5-hexamethyltrisiloxane 3-diethylamino-3-(trimethylsiloxy)-1,1,1,5,5,5-hexamethyltrisiloxane

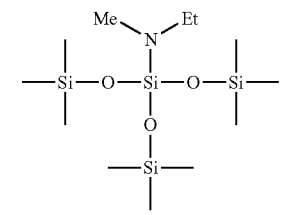

3-ethylmethylamino-3-(trimethylsiloxy)-1,1,1,5,5,5-hexamethyltrisiloxane

TABLE 1a-continued

Exemplary organoamino-polysiloxanes having Formulae A-H 3-di-iso-propylamino-3-(trimethylsiloxy)-1,1,1,5,5,5-hexamethyltrisiloxane 3-dimethylamino-3-(dimethylsiloxy)-1,1,5,5-tetramethyltrisiloxane 3-diethylamino-3-(dimethylsiloxy)-1,1,5,5-tetramethyltrisiloxane 3-ethylmethylamino-3-(dimethylsiloxy)-1,1,5,5-tetramethyltrisiloxane 3-di-iso-propylamino-3-(dimethylsiloxy)-1,1,5,5-tetramethyltrisiloxane 1-dimethylamino-3-(dimethylsiloxy)-1,1,3,5,5-pentamethyltrisiloxane 1-diethylamino-3-(dimethylsiloxy)-1,1,3,5,5-pentamethyltrisiloxane 1-ethylmethylamino-3-(dimethylsiloxy)-1,1,3,5,5-pentamethyltrisiloxane 1-di-iso-propylamino-3-(dimethylsiloxy)-1,1,3,5,5-pentamethyltrisiloxane 3-dimethylamino-1,1,1,5,5,5-hexamethyltrisiloxane 3-diethylamino-1,1,1,5,5,5-hexamethyltrisiloxane 3-ethylmethylamino-1,1,1,5,5,5-hexamethyltrisiloxane 3-di-iso-propylamino-1,1,1,3,5,5,5-hexamethyltrisiloxane 3-dimethylamino-1,1,5,5-tetramethyltrisiloxane TABLE 1a-continued Exemplary organoamino-polysiloxanes having Formulae A-H

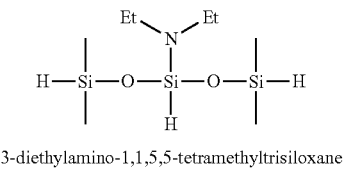

3-diethylamino-1,1,5,5-tetramethyltrisiloxane

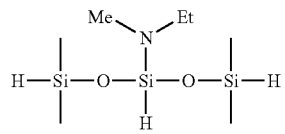

3-ethylmethylamino-1,1,5,5-tetramethyltrisiloxane

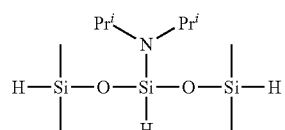

3-di-iso-propylamino-1,1,5,5-tetraamethyltrisiloxane

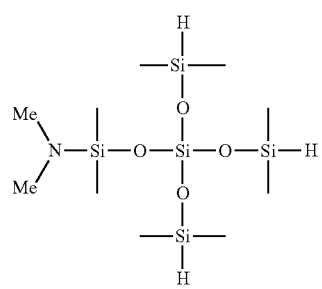

1-dimethylamino-3,3-bis(dimethylsiloxy)-1,1,5,5-tetramethyltrisiloxane

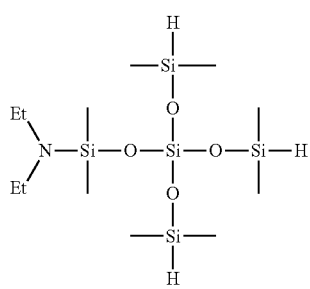

1-diethylamino-3,3-bis(dimethylsiloxy)-1,1,5,5-tetramethyltrisiloxane

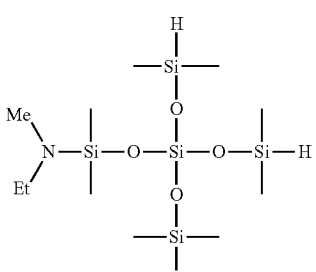

1-ethylmethylamino-3,3-bis(dimethylsiloxy)-1,1,5,5-tetramethyltrisiloxane

TABLE 1a-continued

Exemplary organoamino-polysiloxanes having Formulae A-H

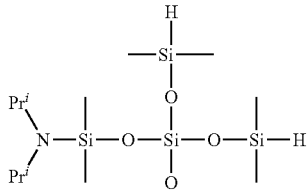

1-di-iso-propylamino-3,3-bis(dimethylsiloxy)-1,1,5,5-tetramethyltrisiloxane

Table 1b provides exemplary organoamino-polysiloxanes having Formulae A-H wherein $R^1$ is hydrogen and $R^2$ is selected from a $C_1$ to $C_4$ alkyl group.

TABLE 1b

Exemplary orcanoamino-polysiloxanes having Formulae A and C wherein $R^1$ is hydrogen and $R^2$ is selected from a $C_1$ to $C_4$ alkyl group such as Me, Et, $Pr^n$, $Pr^i$, $Bu^t$, $Bu^i$ or $Bu^s$.

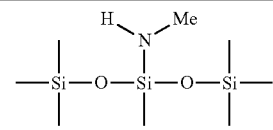

3-methylamino-1,1,1,3,5,5,5-heptamethyltrisiloxane

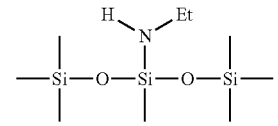

3-ethylamino-1,1,1,3,5,5,5-heptamethyltrisiloxane

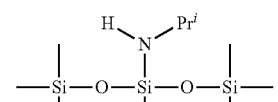

3-iso-propylamino-1,1,1,3,5,5,5-heptamethyltrisiloxane

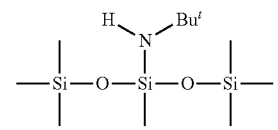

3-tert-butylamino-1,1,1,3,5,5,5-heptamethyltrisiloxane

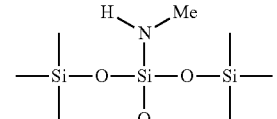

3-methylamino-3-(trimethylsiloxy)-1,1,1,5,5,5-hexamethyltrisiloxane

TABLE 1b-continued

Exemplary orcanoamino-polysiloxanes having Formulae A and C wherein $R^1$ is hydrogen and $R^2$ is selected from a $C_1$ to $C_4$ alkyl group such as Me, Et, $Pr^n$, $Pr^i$, $Bu^t$, $Bu^i$ or $Bu^s$.

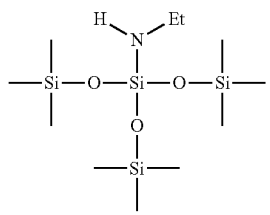

3-ethylamino-3-(trimethylsiloxy)-1,1,1,5,5,5-hexamethyltrisiloxane

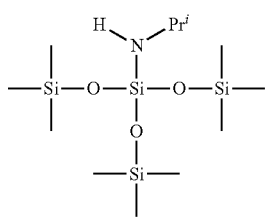

3-iso-propylamino-3-(trimethylsiloxy)-1,1,1,5,5,5-hexamethyltrisiloxane

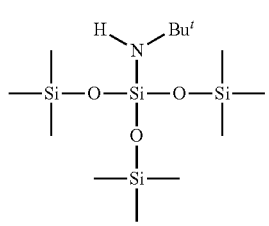

3-tert-butylmino-3-(trimethylsiloxy)-1,1,1,5,5,5-hexamethyltrisiloxane

Compounds having Formulae A or C can be synthesized, for example, by catalytic dehydrocoupling with organoamines with a polysiloxane having at least one Si—H group (e.g. Equation 1-2).

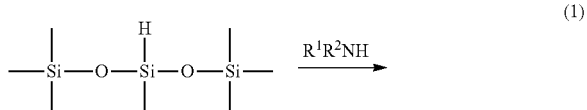

(1)

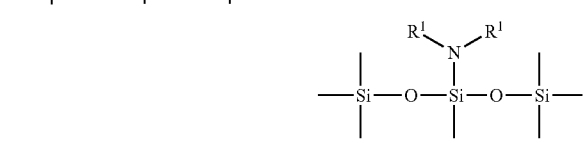

(2)

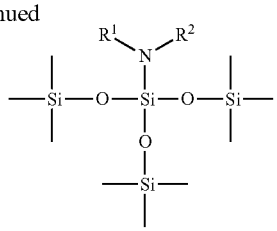

Likewise, Formulae B, D, E, F, G, and H can also be prepared in a similar fashion as equation (1) or (2) with a suitable dehydrocoupling catalyst.

Preferably, the molar ratio of polysiloxane to organoamine in the reaction mixture is from about 1 to 1.0, 1 to 1.5, 1 to 2, 1 to 3, 1 to 4, or from 1 to 10.

The catalyst employed in the method of the present invention in equations (1) and (2) is one that promotes the formation of a silicon-nitrogen bond. Exemplary catalysts include, but not limited to, tris(pentafluorophenyl)borane, $BR_3$ (wherein R is selected from a linear, branched, or cyclic $C_1$ to $C_{10}$ alkyl groupgroup, a $C_5$ to $C_{10}$ aryl group, or a $C_1$ to $C_{10}$ alkoxy group), 1,3-disopropyl-4,5-dimethylimidazol-2-ylidene, 2,2'-bipyridyl, phenanthroline, $Mg[N(SiMe_3)_2]_2$, [tris(4,4-dimethyl-2-oxazolinyl)phenylborate]MgMe, [tris(4,4-dimethyl-2-oxazolinyl)phenylborate]MgH, trimethylaluminium, triethylaluminum, aluminum chloride, $Ca[N(SiMe_3)_2]_2$, dibenzylcalcium, $\{CH—[CMeNC_6H_3-2,6-^iPr_2]_2\}CaH$, triruthenium dodecacarbonyl, $\{CH—[CMeNC_6H_3-2,6-^iPr_2]_2\}Ca[N(SiMe_3)_2]$, bis(cyclopentadienyl)dialkylltitanium(IV), bis(cylopentadienyl)titanium(IV)difluoride, bis(cylopentadienyl)titanium(IV)dichloride, bis(cylopentadienyl)titanium(IV)dihydride, $TiMe_2(dmpe)_2$ [dmpe=1,2-bis(dimethylphosphino)ethane], $(C_5H_5)_2Ti(OAr)_2$ [Ar=(2,6-(iPr)_2C_6H_3)], $(C_5H_5)_2Ti(SiHRR')PMe_3$ [wherein R, R' are each independently selected from a hydrogen atom (H), a methyl group (Me), and a phenyl (Ph) group], bis(benzene) chromium(0), chromium hexacarbonyl, dimanganese decacarbonyl, $[Mn(CO)_4Br]_2$, iron pentacarbonyl, $(C_5H_5)Fe(CO)_2Me$, dicobalt octacarbonyl, nickel(II) acetate, nickel(II) chloride, $[(dippe)Ni(\mu-H)]_2$ [dippe=1,2-bis(diisopropylphosphino)ethane], $(R\text{-indenyl})Ni(PR'_3)Me$ [wherein R is selected from 1-i-Pr, 1-SiMe_3, and 1,3-(SiMe_3)_2; wherein R' is selected from a methyl (Me) group and a phenyl (Ph) group], $[\{Ni(\eta\text{-}CH_2:CHSiMe_2)_2O\}_2\{\mu\text{-}(\eta\text{-}CH_2:CHSiMe_2)_2O\}]$, nickel(II) acetylacetonate, ni(cyclooctadiene)_2, copper(II) fluoride, copper(I) chloride, copper(II) chloride, copper(I) bromide, copper(II) bromide, copper(I) iodide, copper(I) acetate, $Cu(PPh_3)_3Cl$, zinc chloride, [tris(4,4-dimethyl-2-oxazolinyl)phenylborate]ZnH, $Sr[N(SiMe_3)_2]_2$, Bis(cyclopentadienyl)dialkyllzirconium(IV), Bis(cyclopentadienyl)zirconium(IV)difluoride, Bis(cylopentadienyl)zirconium(IV)dichloride, bis(cylopentadienyl)zirconium(IV)dihydride, $[(Et_3P)Ru(2,6\text{-dimesitylthiophenolate})][B[3,5\text{-}(CF_3)_2C_6H_3]_4]$, $(C_5Me_5)Ru(R_3P)_x(NCMe)_{3-x}]^+$ (wherein R is selected from a linear, branched, or cyclic $C_1$ to $C_{10}$ alkyl group and a $C_5$ to $C_{10}$ aryl group; x=0, 1, 2, 3), tris(triphenylphosphine) rhodium(I) carbonyl hydride, di-µ-chloro-tetracarbonyldirhodium(I), tris(triphenylphosphine) rhodium(I) chloride (Wilkinson's Catalyst), hexarhodium hexadecacarbonyl, tris(triphenylphosphine)rhodium(I) carbonyl hydride, bis(triphenylphosphine)rhodium(I) carbonyl chloride, [RhCl(cyclooctadiene)]_2, tris(dibenzylideneacetone)dipalladium(0), tetrakis(triphenylphosphine)palladium(0), palladium(II) acetate, palladium(II) chloride, palladium(II) iodide, cesium carbonate, $(C_5H_5)_2SmH$, $(C_5Me_5)_2SmH$, (NHC)Yb(N(SiMe$_3$)$_2$)$_2$ [NHC=1,3-bis(2,4,6-trimethylphenyl)imidazol-2-ylidene)], tungsten hexacarbonyl, dirhenium decacarbonyl, triosmium dodecacarbonyl, tetrairidium dodecacarbonyl, (acetylacetonato) dicarbonyliridium(I), (POCOP)IrHCl [(POCOP)=2,6-(R$_2$PO)$_2$C$_6$H$_3$, (R is selected from isopropyl ($^i$Pr), normal butyl ($^n$Bu), and methyl (Me)], Ir(Me)$_2$(C$_5$Me$_5$)L [wherein L is selected from PMe$_3$ and PPh$_3$], [Ir(cyclooctadiene)OMe]$_2$, platinum(0)-1,3-divinyl-1,1,3,3-tetramethyldisiloxane (Karstedt's Catalyst), H$_2$PtCl$_6$.nH$_2$O (chloroplatinic acid), bis(tri-tert-butylphosphine)platinum(0), PtO$_2$, and Pt(cyclooctadiene)$_2$.

Catalysts can also be the present affixed to a support. The support is a solid with a high surface area. Typical support materials include but are not limited to: alumina, MgO, zeolites, carbon, Monolith cordierite, diatomaceous earth, silica gel, silica/alumina, ZrO and TiO$_2$. Preferred supports are carbon (for examples, platinum on carbon, palladium on carbon, rhodium on carbon, ruthenium on carbon) alumina, silica and MgO. Metal loading of the catalyst ranges between about 0.01 weight percent to about 50 weight percent. A preferred range is about 0.5 weight percent to about 20 weight percent. A more preferred range is about 0.5 weight percent to about 10 weight percent. Catalysts requiring activation may be activated by a number of known methods. Heating the catalyst under vacuum is a preferred method.

The catalyst may be activated before addition to the reaction vessel or in the reaction vessel prior adding the reactants. The catalyst may contain a promoter. Promoters are substances which themselves are not catalysts, but when mixed in small quantities with the active catalysts increase their efficiency (activity and/or selectivity). Promoters are usually metals such as Mn, Ce, Mo, Li, Re, Ga, Cu, Ru, Pd, Rh, Ir, Fe, Ni, Pt, Cr, Cu and Au and/or their oxides. They can be added separately to the reactor vessel or they can be part of the catalysts themselves. For example, Ru/Mn/C (ruthenium on carbon promoted by manganese) or Pt/CeO$_2$/Ir/SiO$_2$ (Platinum on silica promoted by ceria and iridium). Some promoters can act as catalyst by themselves but their use in combination with the main catalyst can improve the main catalyst's activity. A catalyst may act as a promoter for other catalysts. In this context, the catalyst can be called a bimetallic (or polymetallic) catalyst. For example, Ru/Rh/C can be called either ruthenium and rhodium on carbon bimetallic catalyst or ruthenium on carbon promoted by rhodium. An active catalyst is a material that acts as a catalyst in a specific chemical reaction.

The molar ratio of catalyst to polysiloxane in the reaction mixture ranges from 0.1 to 1, 0.05 to 1, 0.01 to 1, 0.005 to 1, 0.001 to 1, 0.0005 to 1, 0.0001 to 1, 0.00005 to 1, or 0.00001 to 1. In one particular embodiment 0.05 to 0.07 equivalents of catalyst is used per equivalent of polysiloxane. In another particular embodiment 0.00008 equivalents of catalyst is used per equivalent of polysiloxane.

In certain embodiments, the reaction mixture comprising the polysiloxane, organoamine and catalyst(s) further comprises an anhydrous solvent. Exemplary solvents may include, but are not limited to linear-, branched-, cyclic- or poly-ethers (e.g., tetrahydrofuran (THF), diethyl ether, diglyme, and/or tetraglyme); linear-, branched-, or cyclic-alkanes, alkenes, aromatics and halocarbons (e.g. pentane, hexanes, toluene and dichloromethane). The selection of one or more solvent, if added, may be influenced by its compatibility with reagents contained within the reaction mixture, the solubility of the catalyst, and/or the separation process for the intermediate product and/or the end product chosen. In other embodiments, the reaction mixture does not comprise a solvent.

In the method described herein, the reaction between the polysiloxane and the organoamine occurs at one or more temperatures ranging from about 0° C. to about 100° C. Exemplary temperatures for the reaction include ranges having any one or more of the following endpoints: 0, 10, 20, 30, 40, 50, 60, 70, 80, 90, or 100° C. The suitable temperature range for this reaction may be dictated by the physical properties of the reagent, and optional solvent. Examples of particular reactor temperature ranges include but are not limited to, 0° C. to 80° C. or from 0° C. to 30° C.

In certain embodiments of the method described herein, the pressure of the reaction may range from about 1 to about 115 psia or from about 15 to about 45 psia. In some embodiments where the polysiloxane is a liquid under ambient conditions, the reaction is run at atmospheric pressure. In some embodiments where the polysiloxane is a gas under ambient conditions, the reaction is run under above 15 psia.

In certain embodiments, one or more reagents may be introduced to the reaction mixture as a liquid or a vapor. In embodiments where one or more of the reagents is added as a vapor, a non-reactive gas such as nitrogen or an inert gas may be employed as a carrier gas to deliver the vapor to the reaction mixture. In embodiments where one or more of the reagents is added as a liquid, the regent may be added neat, or alternatively diluted with a solvent. The reagent is fed to the reaction mixture until the desired conversion to the crude mixture containing the product, or crude liquid, has been achieved. In certain embodiments, the reaction may be run in a continuous manner by replenishing the reactants and removing the reaction products and the crude liquid from the reactor.

The crude mixture comprising a compounds of Formulae A-H, catalyst(s), and potentially residual organoamine, solvent(s), or undesired product(s) may require separation process(es). Examples of suitable separation processes include, but are not limited to, distillation, evaporation, membrane separation, filtration, vapor phase transfer, extraction, fractional distillation using an inverted column, and combinations thereof.

Compounds having Formulae A or C can be synthesized using equation (3) or (4).

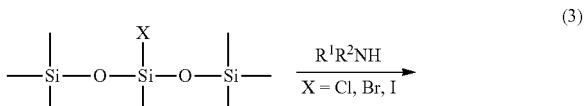

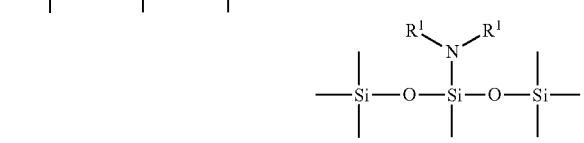

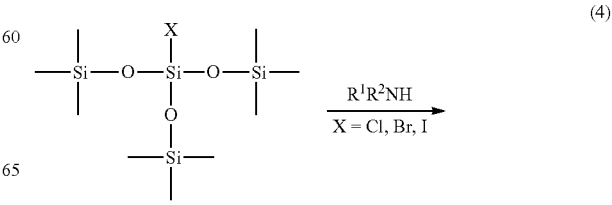

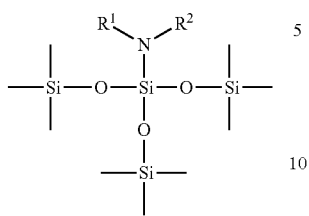

Likewise, Formulae B, D, E, F, G, and H can also be prepared in a similar fashion as equation (3) or (4).

Compounds having Formulae A to H can also be synthesized by attaching the organoamino group to a chloropolysiloxane by reacting the Si—Cl bond with an alkali metal amide reagent.

In addition, compounds having Formulae A to H can also be synthesized by attaching the organoamino group to a hydridopolysiloxane by reacting an Si—H bond with an imine in the presence of a suitable hydrosilylation catalyst.

In addition, compounds having Formulae A to H can also be synthesized by replacing a phenyl group bound to a polysiloxane unit with an organoamino group by reacting the Si-Ph bond with a strong acid such as HCl or triflic acid, followed by addition of the appropriate organoamine.

Accordingly, the disclosure provides a method of preparing an organoamino-polysiloxane compound having a structure represented by Formulae A to H:

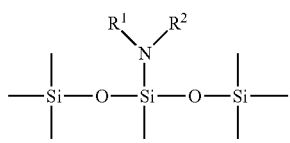

A

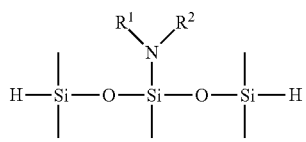

B

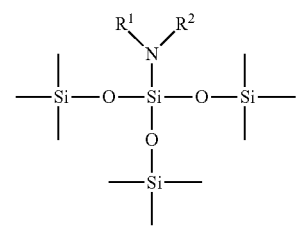

C

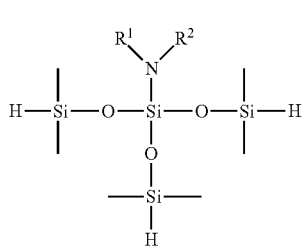

D

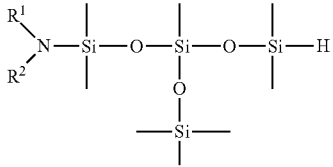

E

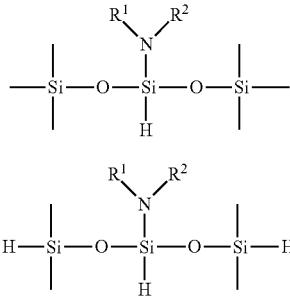

F

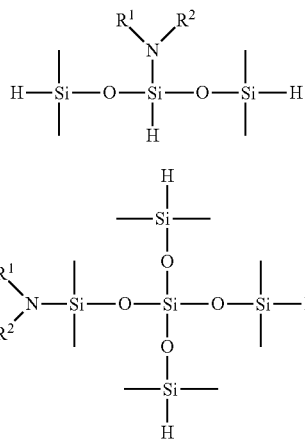

G

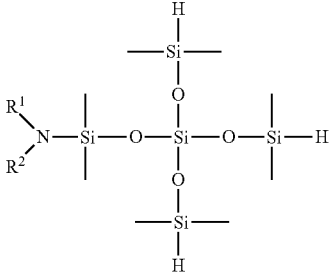

H wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formulae A-H are either linked to form a cyclic ring structure or are not linked to form a cyclic ring, wherein the method comprises the steps of: a) contacting the reactants $R^1R^2NH$ and a polysiloxane having at least one Si—H group in the presence of a catalyst, thus forming a reaction mixture, wherein $R^1$ and $R^2$ are as defined above; b) optionally adding a solvent to the reaction mixture; c) maintaining the reaction mixture at a temperature between about zero ° C. to about 300° C.; and d) allowing the reaction to proceed to form the organoamino-polysiloxane compound from the reaction mixture.

The organoamino-polysiloxane precursor compounds having Formulae A to H according to the present invention and compositions comprising the organoamino-polysiloxane precursor compounds having Formulae A to H according to the present invention are preferably substantially free of halide ions. As used herein, the term "substantially free" as it relates to halide ions (or halides) such as, for example, chlorides and fluorides, bromides, and iodides, means less than less than 5 ppm (by weight) measured by ICP-MS, preferably less than 3 ppm measured by ICP-MS, and more preferably less than 1 ppm measured by ICP-MS, and most preferably 0 ppm measured by ICP-MS. Chlorides are known to act as decomposition catalysts for the organoamino-polysiloxane precursor compounds having Formulae A to H. Significant levels of chloride in the final product can cause the organoamino-polysiloxane precursor compounds to degrade. The gradual degradation of the organoamino-polysiloxane precursor compounds may directly impact the film deposition process making it difficult for the semiconductor manufacturer to meet film specifications. In addition, the shelf-life or stability is negatively impacted by the higher degradation rate of the organoamino-polysiloxane precursor compounds thereby making it difficult to guarantee a 1-2 year shelf-life. Therefore, the accelerated decomposition of the organoamino-polysiloxane precursor compounds presents safety and performance concerns related to the formation of these flammable and/or pyrophoric gaseous byproducts. The organoamino-polysiloxane precursor compounds having Formulae A to H are preferably substantially free of metal ions or metal such as Li, Mg, Ca, K, Al, Fe, Ni, Cr as measured by ICP-MS or other analytical method for measuring metals. As used herein, the term "substantially free" as it relates to Li, Mg, Ca, K, Al, Fe, Ni, Cr means less than 5 ppm (by weight), preferably less than 3 ppm, and more preferably less than 1 ppm, and most preferably 0.1 ppm as measured by ICP-MS. In some embodiments, the organoamino-polysiloxane precursor compounds having Formula A to H are free of metal such as as Li, Mg, Ca, K, Al, Fe, Ni, Cr. As used herein, the term "free of" metal ions or metal impurities as it relates to Li, Mg, Ca, K, Al, Fe, Ni, Cr, noble metal such as volatile Ru or Pt complexes from ruthenium or platinum catalysts used in the synthesis, means less than 1 ppm, preferably 0.1 ppm (by weight) as measured by ICP-MS or other analytical method for measuring metals For those embodiments wherein at least one organoamino-polysiloxane precursor(s) having Formulae A to H is (are) used in a composition comprising a solvent, the solvent or mixture thereof selected does not react with the organoamino-polysiloxane precursor. The amount of solvent by weight percentage in the composition ranges from 0.5 wt % by weight to 99.5 wt % or from 10 wt % by weight to 75 wt % in order to tune the physical properties such as viscosity for direct liquid injection of the resulting composition. In this or other embodiments, the solvent has a boiling point (b.p.) similar to the b.p. of the organoamino-polysiloxane precursor of Formula A to H or the difference between the b.p. of the solvent and the b.p. of the organoamino-polysiloxane precursor of Formula A to H is 40° C. or less, 30° C. or less, or 20° C. or less, or 10° C. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N', N'-Tetramethylethylenediamine), a nitrile (such as benzonitrile), an alkyl hydrocarbon (such as octane, nonane, dodecane, ethylcyclohexane), a siloxane (such as hexamethyldisiloxane, octamethyltrisiloxane), an aromatic hydrocarbon (such as toluene, mesitylene), a tertiary aminoether (such as bis(2-dimethylaminoethyl) ether), or mixtures thereof.

Another embodiment of the invention relates to a silicon oxide film comprising at least one of the following characteristics a density of at least about 2.1 g/cc; a wet etch rate that is less than about 2.5 Å/s as measured in a solution of 1:100 of HF to water dilute HF (0.5 wt. % dHF) acid; an electrical leakage of less than about 1 e-8 A/cm² up to 6 MV/cm; and a hydrogen impurity of less than about 5 e20 at/cc as measured by Secondary Ion Mass Spectrometry (SIMS).

In another aspect, there is provided a method for depositing a film comprising silicon and oxide onto a substrate, the method comprising the steps of: a) providing a substrate in a reactor; b) introducing into the reactor a composition comprising at least one organoamino-polysiloxane compound selected from the group consisting of Formulae A, B, C, D, E, F, G, and H:

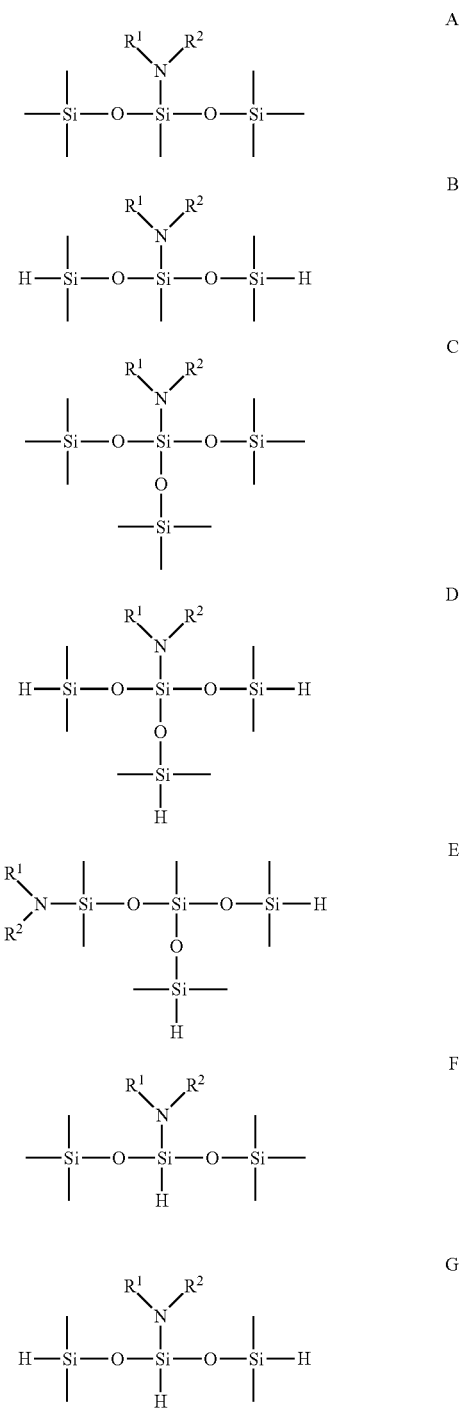

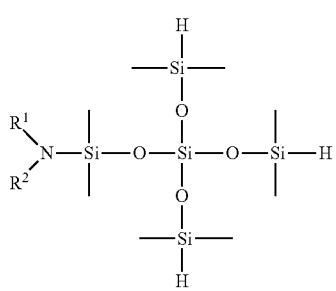

wherein R¹ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and R² is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein R¹ and R² in Formulae A-H are either linked to form a cyclic ring structure or are not linked to form a cyclic ring; c) purging the reactor with a purge gas; d) introducing at least one of an oxygen-containing source and a nitrogen-containing source into the reactor; and e) purging the reactor with the purge gas, wherein the steps b through e are repeated until a desired thickness of film is deposited; and wherein the method is conducted at one or more temperatures ranging from about 25° C. to 600° C.

The methods disclosed herein form a silicon oxide film comprising at least one of the following characteristics a density of at least about 2.1 g/cc; a wet etch rate that is less than about 2.5 Å/s as measured in a solution of 1:100 of HF to water dilute HF (0.5 wt. % dHF) acid; an electrical leakage of less than about 1 e-8 A/cm² up to 6 MV/cm; and a hydrogen impurity of less than about 5 e20 at/cc as measured by Secondary Ion Mass Spectrometry (SIMS).

In certain embodiments of the method and composition described herein, a layer of silicon-containing dielectric material, for example, is deposited on at a least a portion of a substrate via a chemical vapor deposition (CVD) process employing a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("SiO₂"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, SiO₂, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen (N₂), helium (He), neon, hydrogen (H₂), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

Throughout the description, the term "ALD or ALD-like" refers to a process including, but not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor.

The method of the present invention is conducted via an ALD process that uses ozone or an oxygen-containing source which comprises a plasma wherein the plasma can further comprise an inert gas such as one or more of the following: an oxygen plasma with or without inert gas, a water vapor plasma with or without inert gas, a nitrogen oxide (e.g., N₂O, NO, NO₂) plasma with or without inert gas, a carbon oxide (e.g., CO₂, CO) plasma with or without inert gas, and combinations thereof.

The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one organoamino-polysiloxane precursor and optionally an inert gas.

In one or more embodiments described above, the oxygen-containing plasma source is selected from the group consisting of oxygen plasma with or without inert gas water vapor plasma with or without inert gas, nitrogen oxides (N₂O, NO, NO₂) plasma with or without inert gas, carbon oxides (CO₂, CO) plasma with or without inert gas, and combinations thereof. In certain embodiments, the oxygen-containing plasma source further comprises an inert gas. In these embodiments, the inert gas is selected from the group consisting of argon, helium, nitrogen, hydrogen, or combinations thereof. In an alternative embodiment, the oxygen-containing plasma source does not comprise an inert gas.

In certain embodiments, silicon oxide or carbon doped silicon oxide films deposited using the methods described herein are formed in the presence of oxygen-containing source comprising ozone, water (H₂O) (e.g., deionized water, purifier water, and/or distilled water), oxygen (O₂), oxygen plasma, NO, N₂O, NO₂, carbon monoxide (CO), carbon dioxide (CO₂) and combinations thereof. The oxygen-containing source is passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma. In certain embodiments, the oxygen-containing plasma source comprises an oxygen source gas that is introduced into the reactor at a flow rate ranging from about 1 to about 2000 standard cubic centimeter per minute (sccm) or from about 1 to about 1000 sccm. The oxygen-containing plasma source can be introduced for a time that ranges from about 0.1 to about 100 seconds. In one particular embodiment, the oxygen-containing plasma source comprises water having a temperature of 10° C. or greater. In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds) depending on the ALD reactor's volume, and the oxygen-containing plasma source can have a pulse duration that is less than 0.01 seconds (e.g., about 0.001 to about 0.01 seconds).

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, and/or other precursors, source gases, and/or reagents may be performed by changing the time for supplying them to change the stoichiometric composition of the resulting dielectric film.

Energy is applied to the at least one of the organoamino-polysiloxane precursors of Formulae A to H, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one organoamino-polysiloxane precursor may be delivered to the reaction chamber such as a plasma enhanced cyclic CVD or PEALD reactor or a batch furnace type reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

As previously mentioned, the purity level of the at least one organoamino-polysiloxane precursor is sufficiently high enough to be acceptable for reliable semiconductor manufacturing. In certain embodiments, the at least one organoamino-polysiloxane precursor described herein comprise less than 2% by weight, or less than 1% by weight, or less than 0.5% by weight of one or more of the following impurities: free amines, free halides or halogen ions, and higher molecular weight species. Higher purity levels of the organoamino-polysiloxane precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the at least one organoamino-polysiloxane precursor and an oxygen plasma source. The PEALD-like process is defined as a plasma enhanced cyclic CVD process but still provides high conformal silicon and oxygen-containing films.

In certain embodiments, the gas lines connecting from the precursor canisters to the reaction chamber are heated to one or more temperatures depending upon the process requirements and the container of the at least one organoamino-polysiloxane precursor is kept at one or more temperatures for bubbling. In other embodiments, a solution comprising the at least one organoamino-polysiloxane precursor is injected into a vaporizer kept at one or more temperatures for direct liquid injection.

A flow of argon and/or other gas may be employed as a carrier gas to help deliver the vapor of the at least one organoamino-polysiloxane precursor to the reaction chamber during the precursor pulsing. In certain embodiments, the reaction chamber process pressure is about 50 mTorr to 10 Torr. In other embodiments, the reaction chamber process pressure can be up to 760 Torr (e.g., about 50 mtorr to about 100 Torr).

In a typical PEALD or a PEALD-like process such as a PECCVD process, the substrate such as a silicon oxide substrate is heated on a heater stage in a reaction chamber that is exposed to the organoamino-polysiloxane precursor initially to allow the complex to chemically adsorb onto the surface of the substrate.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases, for example, may be performed by varying the duration of the time for supplying them to change the stoichiometric composition of the resulting dielectric film. Also, purge times after precursor or oxidant steps can be minimized to <0.1 s so that throughput is improved.

In another embodiment, a vessel or container employing a composition comprising at least organoamino-polysiloxane precursor having a structure represented by Formulae A to H, and/or solvent for depositing a silicon oxide is described herein.

In one particular embodiment, the vessel or container (vessel and container are exchangeable) comprises at least one pressurizable vessel (preferably of stainless steel) fitted with the proper valves and fittings to allow the delivery of one or more precursors to the reactor for deposition process, such as an ALD or PEALD process. In this or other embodiments, the composition comprising at least one organoamino-polysiloxane precursor having a structure represented by Formulae A to H is provided in a pressurizable vessel comprised of stainless steel and the purity of the precursor is 98% by weight or greater or 99.5% or greater which is suitable for the majority of semiconductor applications, as well as an inert gas selected from the group consisting of argon (Ar), nitrogen ($N_2$), helium (He), neon, and combinations thereof.

In one embodiment of the present invention, a method is described herein for depositing a silicon and oxygen containing film on at least one surface of a substrate, wherein the method comprises the steps of:
a. providing a substrate in a reactor;
b. introducing into the reactor at least one organoamino-polysiloxane precursor having Formulae A to H as defined above;
c. purging the reactor with purge gas;
d. introducing oxygen-containing source comprising a plasma into the reactor; and
e. purging the reactor with a purge gas.

In this method, steps b through e are repeated until a desired thickness of film is deposited on the substrate.

In one particular embodiment, the method described herein deposits a high quality silicon and oxygen containing film on a substrate. The method comprises the following steps:
a. providing a substrate in a reactor;
b. introducing into the reactor at least one organoamino-polysiloxane precursor having the Formulae A to H described herein;
c. purging reactor with purge gas to remove at least a portion of the unabsorbed precursors;
d. introducing an oxygen-containing plasma source into the reactor and
e. purging reactor with purge gas to remove at least a portion of the unreacted oxygen source,
wherein steps b through e are repeated until a desired thickness of the silicon-containing film is deposited.

In another particular embodiment, the method described herein deposits a high quality silicon and oxygen containing film on a substrate at temperatures greater than 600° C. The method comprises the following steps:
a. providing a substrate in a reactor;
b. introducing into the reactor at least one organoamino-polysiloxane precursor having the Formulae A or C described herein;
c. purging reactor with purge gas to remove at least a portion of the unabsorbed precursors;
d. introducing an oxygen-containing plasma source into the reactor and
e. purging reactor with purge gas to remove at least a portion of the unreacted oxygen source,
wherein steps b through e are repeated until a desired thickness of the silicon-containing film is deposited. It is believed that organoamino-polysiloxane precursors having Formulae A and C are preferred for this method because they do not comprise any Si—H groups since Si—H groups can decompose at temperatures higher than 600° C. and can potential cause undesired chemical vapor deposition. However, it is possible that under certain conditions, such as using short precursor pulses or low reactor pressures or rotating the substrate, this method can also be carried out using organoamino-polysiloxane precursors having Formulae B, D, E, F, G, or H at temperatures above 600° C. without significant undesirable chemical vapor deposition.

Another method disclosed herein forms a carbon doped silicon oxide film using a organoamino-polysiloxane precursor compound having the chemical structure represented by Formulae A to H as defined above plus an oxygen source.

Another exemplary process is described as follows:
a. providing a substrate in a reactor;
b. contacting vapors generated from at least one organoamino-polysiloxane precursor compound having a structure represented by Formulae A to H as defined above, with or without co-flowing an oxygen source to chemically absorb the precursors on the heated substrate;
c. purging away any unabsorbed precursors;
d. Introducing an oxygen source on the heated substrate to react with the absorbed precursors; and,
e. purging away any unreacted oxygen source,
wherein steps b through e are repeated until a desired thickness is achieved.

In another particular embodiment, the method described herein deposits a high quality silicon oxynitride film, on a substrate. The method comprises the following steps:
a. providing a substrate in a reactor;
b. introducing into the reactor at least one organoamino-polysiloxane precursor having the Formulae A to H described herein;
c. purging reactor with purge gas to remove at least a portion of the unabsorbed precursors;
d. introducing a nitrogen-containing plasma source into the reactor and
e. purging reactor with purge gas to remove at least a portion of the unreacted nitrogen source,
wherein steps b through e are repeated until a desired thickness of the silicon oxynitride containing film is deposited.

Another exemplary process is described as follows:
a. providing a substrate in a reactor;
b. contacting vapors generated from at least one organoamino-polysiloxane precursor compound having a structure represented by Formula A to H as defined above, with or without co-flowing a nitrogen source to chemically absorb the precursors on the heated substrate;
c. purging away any unabsorbed precursors;
d. Introducing a nitrogen source on the heated substrate to react with the absorbed precursors; and,
e. purging away any unreacted nitrogen source,
wherein steps b through e are repeated until a desired thickness is achieved.

One more exemplary process is described as follows:
a. providing a substrate in a reactor;
b. contacting vapors generated from at least one organoamino-polysiloxane precursor compound having a structure represented by Formula A to H as defined above, with or without co-flowing a nitrogen source to chemically absorb the precursors on the heated substrate;

c. purging away any unabsorbed precursors;

d. Introducing a nitrogen source on the heated substrate to react with the absorbed precursors; and, e. purging away any unreacted nitrogen source, f. Introducing an oxygen source on the heated substrate to react with the absorbed precursors; and, g. purging away any unreacted nitrogen source, wherein steps b through g are repeated until a desired thickness of silicon oxynitride containing film is achieved. In other embodiments, step f can be conducted in place of step d, i.e. an oxygen source is introduced before nitrogen source to provide silicon oxynitride containing film.

Various commercial ALD reactors such as single wafer, semi-batch, batch furnace or roll to roll reactor can be employed for depositing the solid silicon oxide, silicon oxynitride, carbon doped silicon oxynitride, or carbon doped silicon oxide.

Process temperatures for the method described herein use one or more of the following temperatures as endpoints: 0° C., 25° C., 50° C., 75° C., 100° C., 125° C., 150° C., 175° C., 200° C., 225° C., 250° C., 275° C., 300° C., 325° C., 350° C., 375° C., 400° C., 425° C., 450° C., 500° C., 525° C., 550° C., 600° C., 650° C., 700° C., 750° C., 760° C., and 800° C. Exemplary low temperature ranges include, but are not limited to the following: from about 0° C. to about 300° C.; or from about 25° C. to about 300° C.; or from about 50° C. to about 290° C.; or from about 25° C. to about 250° C., or from about 25° C. to about 200° C. Exemplary high temperature ranges include, but are not limited to the following from about 600° C. to about 800° C., from about 700° C. to 800° C.

In another aspect, there is provided a method for depositing a silicon and oxygen containing film via flowable chemical vapor deposition (FCVD), the method comprising:

placing a substrate comprising a surface feature into a reactor wherein the substrate is maintained at one or more temperatures ranging from about −20° C. to about 400° C. and a pressure of the reactor is maintained at 100 torr or less;

introducing at least one compound selected from the group consisting of Formulae A to H:

providing an oxygen source into the reactor to react with the at least one compound to form a film and cover at least a portion of the surface feature;

annealing the film at one or more temperatures of about 100° C. to 1000° C. to coat at least a portion of the surface feature; and treating the substrate with an oxygen source at one or more temperatures ranging from about 20° C. to about 1000° C. to form the silicon-containing film on at least a portion of the surface feature.

In another aspect, there is provided a method for depositing a silicon, oxygen, and nitrogen containing film via flowable chemical vapor deposition (FCVD), the method comprising:

placing a substrate comprising a surface feature into a reactor wherein the substrate is maintained at one or more temperatures ranging from about −20° C. to about 400° C. and a pressure of the reactor is maintained at 100 torr or less;

introducing at least one compound selected from the group consisting of Formulae A to H:

providing a nitrogen source into the reactor to react with the at least one compound to form a film and cover at least a portion of the surface feature;

annealing the film at one or more temperatures of about 100° C. to 1000° C. to coat at least a portion of the surface feature; and treating the substrate with an oxygen source at one or more temperatures ranging from about 20° C. to about 1000° C. to form the silicon-containing film on at least a portion of the surface feature.

In certain embodiments, the oxygen source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. In other embodiments, the nitrogen source is selected from the group consisting of for example, ammonia, hydrazine, monoalkylhydrazine, dialkylhydrazine, nitrogen, nitrogen/hydrogen, nitrogen/argon plasma, nitrogen/helium plasma, ammonia plasma, nitrogen plasma, nitrogen/hydrogen plasma, organic amines such as tert-butylamine, dimethylamine, diethylamine, isopropylamine, diethylamine plasma, dimethylamine plasma, trimethyl plasma, trimethylamine plasma, ethylenediamine plasma, and an alkoxyamine such as ethanolamine plasma, and mixtures thereof. In yet other embodiments, the nitrogen-containing source comprises an ammonia plasma, a plasma comprising nitrogen and argon, a plasma comprising nitrogen and helium or a plasma comprising hydrogen and nitrogen source gas. In this or other embodiments, the method steps are repeated until the surface features are filled with the silicon-containing film. In embodiments wherein water vapor is employed as an oxygen source in flowable chemical vapor deposition processes, the substrate temperature ranges from about −20° C. to about 40° C. or from about −10° C. to about 25° C.

In a still further embodiment of the method described herein, the film or the as-deposited film deposited from ALD, ALD-like, PEALD, PEALD-like or FCVD is subjected to a treatment step (post deposition). The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film.

The films deposited with the organoamino-polysiloxane precursors having Formulae A to H described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD cycles, such as, without limitation, one (1) ALD cycle, two (2) ALD cycles, five (5) ALD cycles, or after every ten (10) or more ALD cycles.

The precursors of Formulae A to H exhibit a growth rate of 1.5 Å/cycle or greater.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as $H_2O$, $N_2O$, $NO_2$ or $O_2$).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as $SiO_2$ or carbon doped $SiO_2$ is deposited to prevent chlorine and nitrogen contamination to penetrate into film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

Without intending to be bound by a particular theory, it is believed that the organoamino-polysiloxane precursor compound having a chemical structure represented by Formulae A to H as defined above can be anchored via reacting organoamino group with hydroxyl on substrate surface to provide multiple Si—O—Si fragments, thus boosting the growth rate of silicon oxide or carbon doped silicon oxide compared to conventional silicon precursors such as bis(tert-butylamino)silane or bis(diethylamino)silane having only one silicon atom.

In certain embodiments, the organoamino-polysiloxane precursors having Formulae A to H as defined above can also be used as a dopant for metal containing films, such as but not limited to, metal oxide films or metal oxynitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands.

Examples of suitable metal amide precursors that may be used with the method disclosed herein include, but are not limited to, tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metals herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

In certain embodiments, the silicon-containing films described herein have a dielectric constant of 6 or less, 5 or less, 4 or less, and 3 or less. In these or other embodiments, the films can a dielectric constant of about 5 or below, or about 4 or below, or about 3.5 or below. However, it is envisioned that films having other dielectric constants (e.g., higher or lower) can be formed depending upon the desired end-use of the film. An example of silicon-containing film that is formed using the organoamino-polysiloxane precursors having Formula A to H precursors and processes described herein has the formulation $Si_xO_yC_zN_vH_w$ wherein Si ranges from about 10% to about 40%; O ranges from about 0% to about 65%; C ranges from 0% to about 75% or from about 0% to about 50%; N ranges from about 0% to about 75% or from about 0% to 50%; and H ranges from about 0% to about 50% atomic percent weight % wherein x+y+z+v+w=100 atomic weight percent, as determined for example, by XPS or other means. Another example of the silicon containing film that is formed using the organoamino-polysiloxane precursors of Formula A to H and processes described herein is silicon carbo-oxynitride wherein the carbon content is from 1 at. % to 80 at. % measured by XPS. In yet, another example of the silicon containing film that is formed using the organoamino-polysiloxane precursors having Formula A to H and processes described herein is amorphous silicon wherein both sum of nitrogen and carbon contents is <10 at. %, preferably <5 at. %, most preferably <1 at. % measured by XPS.

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon oxycarbide, hydrogenated silicon oxynitride, silicon carbo-oxynitride, hydrogenated silicon carbo-oxynitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

The methods described herein provide a high quality silicon oxide, silicon oxynitride, carbon doped silicon oxynitride, or carbon-doped silicon oxide film. The term "high quality" means a film that exhibits one or more of the following characteristics: a density of about 2.1 g/cc or greater, 2.2 g/cc or greater, 2.25 g/cc or greater; a wet etch rate that is 2.5 Å/s or less, 2.0 Å/s or less, 1.5 Å/s or less, 1.0 Å/s or less, 0.5 Å/s or less, 0.1 Å/s or less, 0.05 Å/s or less, 0.01 Å/s or less as measured in a solution of 1:100 of HF to water dilute HF (0.5 wt. % dHF) acid ; an electrical leakage of about 1 or less e-8 A/cm$^2$ up to 6 MV/cm); a hydrogen impurity of about 5 e20 at/cc or less as measured by SIMS; and combinations thereof. With regard to the etch rate, a thermally grown silicon oxide film has 0.5 Å/s etch rate in 0.5 wt. % Hf.

In certain embodiments, one or more organoamino-polysiloxane precursors having Formulae A to H described herein can be used to form silicon and oxygen containing films that are solid and are non-porous or are substantially free of pores.

The following Examples are provided to illustrate certain aspects of the invention and shall not limit the scope of the appended claims.

EXAMPLES

Thermal Atomic Layer Deposition of silicon oxide films were performed on a laboratory scale ALD processing tool. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12-inch-long silicon strips. A thermocouple is attached on the sample holder to confirm substrate temperature. Depositions were performed using ozone as oxygen source gas. Normal deposition process and parameters are shown in Table 2. Step 2a to 2c are repeated when multiple precursor pulses are used. Steps 1 to 6 are repeated until a desired thickness is reached.

TABLE 2

Process for Thermal Atomic Layer Deposition of Silicon Oxide Films with Ozone as Oxygen Source on the Laboratory Scale ALD Processing Tool.

| Step 1 | 6 sec | Evacuate reactor | <100 mT |
|---|---|---|---|
| Step 2a | variable | Dose Silicon precursor | Reactor pressure typically <2 Torr |
| Step 2b | 6 sec | Purge reactor with nitrogen | Flow 1.5 slpm N$_2$ |
| Step 2c | 6 sec | Evacuate reactor | <100 mT |
| Step 3 | variable | Dose oxygen source ozone | |
| Step 4 | 6 sec | Purge reactor with nitrogen | Flow 1.5 slpm N$_2$ |

Plasma enhanced ALD (PEALD) was performed on a commercial lateral flow reactor (300 mm PEALD tool manufactured by ASM) equipped with 27.1 MHz direct plasma capability with 3.5 mm fixed spacing between electrodes. The laminar flow chamber design utilizes outer and inner chambers which have independent pressure settings. The inner chamber is the deposition reactor in which all reactant gases (e.g. precursor, argon) were mixed in the manifold and delivered to the process reactor. Argon gas was used to maintain reactor pressure in the outer chamber. Precursors were liquids maintained at room temperature in stainless steel bubblers and delivered to the chamber with Ar carrier gas (typically set at 200 sccm flow) or vapor draw. Normal deposition process and parameters are shown in Table 3.

TABLE 3

Process for PEALD Silicon Oxide Deposition in the Commercial Lateral Flow PEALD Reactor with oxygen plasma.

| Step | | |
|---|---|---|
| a | Introduce Si wafer to the reactor | Deposition temperature = 100° C. or 300° C. |
| b | Introduce silicon precursor to the reactor | Vapor draw Precursor pulse = variable seconds or Carrier gas precursor delivery = variable seconds with 200 sccm Ar; Process gas Argon flow = 300 sccm Reactor pressure = 2 or 3 Torr |
| c | Purge silicon precursor with inert gas (argon) | Argon flow = 300 sccm Argon flow time = 30 seconds Reactor pressure = 2 or 3 Torr |
| d | Oxidation using plasma | Argon flow = 300 sccm Oxygen flow = 100 sccm Plasma power = 200 W Plasma time = variable seconds Reactor pressure = 2 or 3 Torr |
| e | Purge O$_2$ plasma | Plasma off Argon flow = 300 sccm Argon flow time = 2 seconds Reactor pressure = 2 or 3 Torr |

All depositions reported in this study were done on native oxide containing Si substrates of 8-12 Ohm-cm. Thickness and refractive indices of the films were measured using a FilmTek 2000SE ellipsometer by fitting the reflection data from the film to a pre-set physical model (e.g., the Lorentz Oscillator model). The growth rate per cycle is calculated by dividing the measured thickness of resulting silicon oxide film by the number of total ALD/PEALD cycles. Wet etch rate (WER) measurements were performed by using 1:99 diluted hydrofluoric (HF) acid solution. Thermal oxide wafers were used as standard for each set of experiments to confirm the etch solution's activity. The samples were all etched for 15 seconds to remove any surface layer before starting to collect the bulk film's WER. A typical thermal oxide wafer wet etch rate for 1:99 dHF water solution was 0.5 Å/s by this procedure. All density measurements were measured by x-ray reflectivity (XRR) method. Compositional analysis was done using secondary ion mass spectrometry (D-SIMS) or X-ray photoelectron spectroscopy (XPS).

Example 1

Preparation of 3-dimethylamino-1,1,1,3,5,5,5-heptamethyltrisiloxane

To 2.26 mL (4.52 mmol) of a solution of 2.0M dimethylamine in THF (dried over molecular sieves) was added 30 mg of Ru$_3$(CO)$_{12}$ directly, whereupon bubbling of the catalyst was observed as it slowly dissolved. This dark orange solution was then added drop-wise to a colorless solution of 0.84 g (3.77mmol) bis(trimethylsiloxy)methylsilane in 5 mL of hexanes under the protection of nitrogen atmosphere. The resulting dark orange solution was allowed to vent while stirring at room temperature overnight. GC-MS showed evidence of the desired dimethylamino-1,1,1,3,5,5,5-heptamethyltrisiloxane product with peaks at m/z=265 (M+), 250 (M–15), 221, 207, 191, 176, 162, 147, 133, 119, 103, 73.

Example 2

Preparation of 3-dimethylamino-1,1,1,3,5,5,5-heptamethyltrisiloxane (prophetic)

A solution containing 3-chloro-1,1,1,3,5,5,5-heptamethyl-trisiloxane is treated with a dimethylamine solution in THF in presence of triethylamine to provide a mixture which is stirred for a period of time. The resulting amine hydrochloride solids are removed by filtration and the dimethylamino-1,1,1,3,5,5,5-heptamethyltrisiloxane product is purified by vacuum distillation.

Example 3

Preparation of 3-dimethylamino-3-(trimethylsiloxy)-1,1,1,5,5,5-hexamethyltrisiloxane (prophetic)

A solution containing 3-(trimethylsiloxy)-1,1,1,5,5,5-hexamethyltrisiloxane is treated with a dimethylamine solution in THF in presence of a catalyst such as Ru, Pt, Pd, or Rh or complexes thereof to provide a mixture which is stirred for a period of time. The resulting 3-dimethylamino-3-(trimethylsiloxy)-1,1,1,5,5,5-hexamethyltrisiloxane product is purified by vacuum distillation.

Example 4

Synthesis of 3-dimethylamino-3-(trimethylsiloxy)-1,1,1,5,5,5-hexamethyltrisiloxane To a 2 L three neck round bottom flask equipped with a mechanical stirrer, condenser, and an additional funnel was loaded 97.5 g (294.47 mmol) tris(trimethylsiloxy)chlorosilane followed by the addition of 800 mL of hexanes. The mixture was chilled to an internal temperature of 0° C. and 36.0 g (355.77 mmol) triethylamine was added drop-wise via the addition funnel. Next, the additional funnel was loaded with 220 mL (440 mmol) of a 2.0M solution of dimethylamine in THF and added drop-wise while maintaining the internal temperature of the reaction at 0° C. After addition, the reaction was removed from the cold bath and allowed to reach room temperature with stirring. After 16 hours, the resulting white slurry was filtered through a medium porosity 300mL filter funnel. Approximately 45 g of salt was collected. The filtrate was subjected to rotary evaporation to remove volatiles (150 Torr at 50° C.). The crude product was purified by vacuum distillation (65° C./<1 Torr) to obtain 73.7 g of 3-dimethylamino-3-(trimethylsiloxy)-1,1,1,5,5,5-hexamethyltrisiloxane. DSC analysis indicated a boiling point of 219° C. GC-MS analysis showed the following peaks: m/z=339 (M+), 324 (M−15), 279, 265, 250, 236, 207, 193, 177, 163, 147, 133, 119, 102, 73.

Example 5

Synthesis of 3-diethylamino-1,1,1,5,5,5-hexamethyltrisiloxane

In a 100 mL round bottom flask equipped with a magnetic stirrer, 1,1,1,5,5,5-hexamethyltrisiloxane (3.6 g, 0.017 mol) and diethylamine (2.5 g, 0.034 mol) were combined and stirred. 30 mg of $Ru_3(CO)_{12}$ solid catalyst was added and the reaction was stirred for 16 hours under the protection of nitrogen, while allowing to vent. The resulting reaction solution was analyzed by GC-MS and found to contain 3-diethylamino-1,1,1,5,5,5-hexamethyltrisiloxane as the major product. GC-MS showed the following peaks: m/z=279 (M+), 264 (M−15), 248, 234, 220, 207, 193, 176, 163, 147, 133, 119, 103, 89, 73.

Example 6

Synthesis of 1-dimethylamino-3,3-bis(dimethylsiloxy)-1,1,5,5-tetramethyltrisiloxane A 2.0 M solution of dimethylamine in THF (0.75 mL, 0.0015 mol), tetrakis(dimethylsiloxy)silane (1.00 g, 0.00304 moL), and $Ru_3(CO)_{12}$ (0.04 g, $6.0 \times 10^{-5}$ mol) were combined in a 20 mL scintillation vial and the mixture was allowed to stir at room temperature under the protection of nitrogen for 1 d. The resulting reaction solution was analyzed by GC-MS and found to contain 1-dimethylamino-3,3-bis(dimethylsiloxy)-1,1,5,5-tetramethyltrisiloxane as the major product. GC-MS showed the following peaks: m/z=371 (M+), 356 (M−15), 341, 327, 311, 296, 281, 267, 253, 239, 223, 207, 193, 179, 162, 148, 133, 119, 102, 88, 73.

Comparative Example 7a

Thermal Atomic Layer Deposition of Silicon Oxide Films with Dimethylaminotrimethylsilane (DMATMS)

Atomic layer deposition of silicon oxide films was conducted using the following precursors DMATMS. The depositions were performed on the laboratory scale ALD processing tool. The silicon precursor was delivered to the chamber by vapor draw. Deposition process and parameters are provided in Table 2. Steps 1 to 6 are repeated until a desired thickness is reached. At 500° C., with the DMATMS precursor dose time of 8 seconds and ozone flow for 4 seconds, the film growth rate per cycle measured is 1.24 Å/cycle and film refractive index is 1.43.

Comparative Example 7b

Plasma Enhanced Atomic Layer Deposition (PEALD) of Silicon Oxide Films with Dimethylaminotrimethylsilane (DMATMS)

Plasma Enhanced Atomic layer deposition of silicon oxide films was conducted using the following precursors DMATMS. The depositions were performed on a commercial lateral flow reactor (300 mm PEALD tool manufactured by ASM) equipped with 27.1 MHz direct plasma. The silicon precursor was delivered to the chamber by vapor draw. Deposition process and parameters are provided in Table 3. Steps 1 to 6 are repeated until a desired thickness is reached. At 100° C., with the DMATMS precursor dose time of 4 seconds and oxygen plasma time for 2 seconds, the film growth rate per cycle measured is 0.88 Å/cycle and film refractive index is 1.49.

Example 8

Deposition of Silicon-Containing Film Via Plasma Enhanced ALD Deposition Using the Silicon precursor 3-dimethylamino-1,1,1,3,5,5,5-heptamethyltrisiloxane and oxygen plasma Depositions were performed with 3-dimethylamino-1,1,1,3,5,5,5-heptamethyltrisiloxane as Si precursor and $O_2$ plasma under conditions given in Table 3. 3-dimethylamino-1,1,1,3,5,5,5-heptamethyltrisiloxane as Si precursor was delivered by carrier gas at ambient temperature (25° C.). Steps b to e were repeated 150 times to get a desired thickness of silicon oxide for metrology. The film growth rate and refractive index are shown in Table 4.

TABLE 4

Summary of PEALD Process Parameters and Results for dimethylamino-1,1,1,3,5,5,5-heptamethyltrisiloxane.

| Condition | Dep T (° C.) | Reactor Pressure (Torr) | Precursor flow (s) | $O_2$ Plasma time (s) | $O_2$ Plasma Power (W) | GPC (Å/cycle) | RI |
|---|---|---|---|---|---|---|---|
| 1 | 100 | 3 | 4 | 5 | 200 | 2.16 | 1.47 |
| 2 | 100 | 3 | 8 | 5 | 200 | 2.23 | 1.47 |
| 3 | 100 | 2 | 8 | 5 | 400 | 2.09 | 1.48 |
| 4 | 100 | 2 | 8 | 5 | 200 | 2.18 | 1.47 |
| 5 | 100 | 2 | 8 | 5 | 100 | 2.30 | 1.47 |
| 6 | 100 | 2 | 8 | 10 | 200 | 2.11 | 1.48 |
| 7 | 300 | 3 | 8 | 5 | 200 | 1.96 | 1.46 |
| 8 | 300 | 2 | 8 | 5 | 400 | 1.83 | 1.47 |
| 9 | 300 | 2 | 8 | 5 | 200 | 1.89 | 1.47 |
| 10 | 300 | 2 | 8 | 5 | 100 | 1.96 | 1.47 |
| 11 | 300 | 2 | 8 | 10 | 200 | 1.83 | 1.48 |

It can be seen that 3-dimethylamino-1,1,1,3,5,5,5-heptamethyltrisiloxane with Si—O—Si linkage gives higher growth rate per cycle than dimethylaminotrimethylsilane without Si—O—Si linkage.

Example 9

Deposition of Silicon-Containing Film Via Plasma Enhanced ALD Deposition Using the Silicon precursor 3-dimethylamino-3-(trimethylsiloxy)-1,1,1,5, 5,5-hexamethyltrisiloxane and oxygen plasma Depositions were performed with 3-dimethylamino-3-(trimethylsiloxy)-1,1,1,5,5,5-hexamethyltrisiloxane as Si precursor and $O_2$ plasma under conditions given in Table 3. 3-dimethylamino-3-(trimethylsiloxy)-1,1,1,5,5,5-hexamethyltrisiloxane as Si precursor was delivered by 200 sccm Ar carrier gas at 60° C. for 100° C. deposition and at 70° C. for 300° C. deposition. Steps b to e were repeated 150 times to get a desired thickness of silicon oxide for metrology. The film growth rate and refractive index are shown in Table 5.

TABLE 5

Summary of PEALD Process Parameters and Results for 3-dimethylamino-3-(trimethylsiloxy)-1,1,1,5,5,5-hexamethyltrisiloxane.

| Condition | Dep T (° C.) | Reactor Pressure (Torr) | Precursor flow (s) | $O_2$ Plasma time (s) | $O_2$ Plasma Power (W) | GPC (Å/cycle) | RI |
|---|---|---|---|---|---|---|---|
| 1 | 100 | 3 | 4 | 5 | 200 | 1.75 | 1.48 |
| 2 | 100 | 3 | 8 | 5 | 200 | 1.94 | 1.47 |
| 3 | 100 | 3 | 16 | 5 | 200 | 2.03 | 1.48 |
| 6 | 300 | 2 | 8 | 5 | 200 | 1.96 | 1.47 |
| 7 | 300 | 2 | 8 | 5 | 400 | 1.85 | 1.47 |

It can be seen that 3-dimethylamino-3-(trimethylsiloxy)-1,1,1,5,5,5-hexamethyltrisiloxane with Si—O—Si linkage gives higher growth rate per cycle than precursor dimethylaminotrimethylsilane without Si—O—Si linkage.

Example 10

Deposition of Silicon-Containing Film Via Thermal ALD Deposition Using the organoamino-polysiloxane precursor 3-dimethylamino-3-(trimethylsiloxy)-1,1,1,5,5,5-hexamethyltrisiloxane and ozone Atomic layer deposition of silicon oxide films was conducted using the following precursors: 3-dimethylamino-3-(trimethylsiloxy)-1,1,1,5,5,5-hexamethyltrisiloxane. The depositions were performed on the laboratory scale ALD processing tool. The silicon precursor was delivered to the chamber by vapor draw. Deposition process and parameters are provided in Table 2. Step 2a to 2c are repeated when multiple precursor pulses are used. Steps 1 to 6 are repeated until a desired thickness is reached. The process parameters of the depositions, the deposition rate and refractive index are provided in Table 6.

TABLE 6

Summary of Process Parameters and Results for 3-dimethylamino-3-(trimethylsiloxy)-1,1,1,5,5,5-hexamethyltrisiloxane.

| Wafer temperature (Celcius) | Precursor dose (seconds) | Ozone dose (seconds) | Deposition Rate (Å/cycle) | Refractive Index |
|---|---|---|---|---|
| 300 | 12 + 12 + 12 | 10 | 1.80 | 1.44 |
| 600 | 12 | 24 | 1.85 | 1.43 |
| 600 | 12 + 12 | 24 | 2.37 | 1.43 |
| 600 | 12 + 12 + 12 | 24 | 2.46 | 1.43 |
| 650 | 12 + 12 + 12 | 10 | 2.58 | 1.43 |

It can be seen that precursor, 3-dimethylamino-3-(trimethylsiloxy)-1,1,1,5,5,5-hexamethyltrisiloxane with Si—O—Si linkage, provides higher growth rate per cycle than precursor DMATMS without the Si—O—Si linkage.

The invention claimed is:

1. A composition comprising at least one organoamino-polysiloxane compound selected from the group consisting of Formulae A B, C, D, E, F, G, and H:

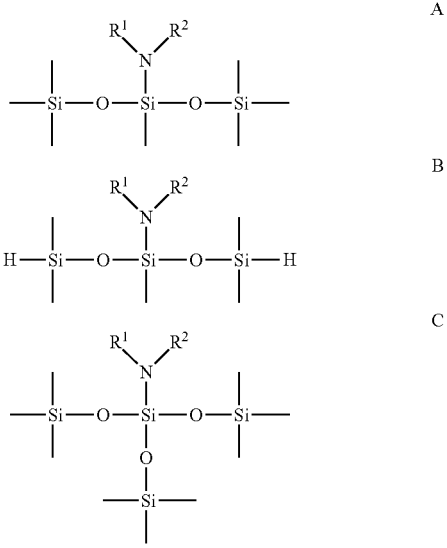

-continued

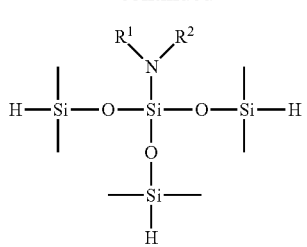
D

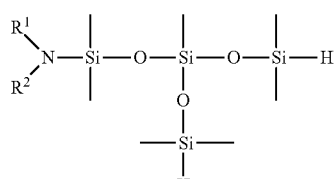
E

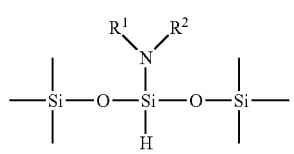
F

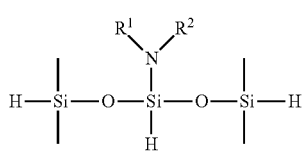
G

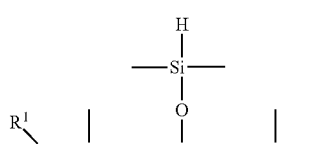
H

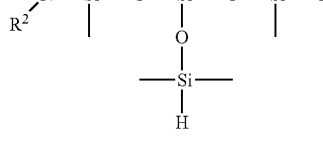

wherein
- $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group;
- $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group,
- $R^3$ is selected from a linear $C_3$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and
- $R^4$ is selected from the group consisting of hydrogen, a $C_3$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group,
- wherein $R^1$ and $R^2$ in Formulae B-H, and $R^3$ and $R^4$ in Formula A, are either linked to form a cyclic ring structure or are not linked to form a cyclic ring structure, and a solvent selected from the group consisting of dibutyl ether, pyridine, 1-methylpiperidine, 1-ethylpiperidine, N,N'-dimethylpiperazine, and N,N,N'N'-tetramethyl-ethylenediamine, benzonitrile, cyclooctane, cyclononane, cyclodecane, ethylcyclohexane, and ethylcyclooctane, a siloxane, mesitylene, a tertiary aminoether, and mixtures thereof.

2. The composition of claim 1 comprising at least one compound selected from the group consisting of Formula A and Formula C.

3. The composition of claim 1 wherein the solvent is dibutyl ether.

4. The composition of claim 1 wherein $R^1$ and $R^2$ are each a $C_1$ to $C_4$ alkyl group.

5. The composition of claim 1 wherein the composition is substantially free of one or more impurities selected from the group consisting of a halide, metal ions, metal, and combinations thereof.

6. The composition of claim 1 wherein the organoaminopolysiloxane compound is selected from the group consisting of 3-di-iso-propylamino-1,1,1,3,5,5,5-heptamethyltrisiloxane, 3-dimethylamino-1,1,3,5,5-pentamethyltrisiloxane, 3-diethylamino-1,1,3,5,5-pentamethyltrisiloxane, 3-ethylmethylamino-1,1,3,5,5-pentamethyltrisiloxane, 3-di-iso-propylamino-1,1,3,5,5-pentamethyltrisiloxane, 3-dimethyl-amino-3-(trimethylsiloxy)-1,1,1,5,5,5-hexamethyltrisiloxane, 3-diethylamino-3-(trimethylsiloxy)-1,1,1,5,5,5-hexamethyltrisiloxane, 3-di-iso-propylamino-3-(trimethylsiloxy)-1,1,1,5,5,5-hexamethyltrisiloxane, 3-dimethylamino-3-(dimethylsiloxy)-1,1,5,5-tetramethyl-trisiloxane, 3-diethylamino-3-(dimethylsiloxy)-1,1,5,5-tetramethyltrisiloxane, 3-ethylmethylamino-3-(dimethylsiloxy)-1,1,5,5-tetramethyltrisiloxane, 3-di-iso-propylamino-3-(dimethylsiloxy)-1,1,5,5-tetramethyltrisiloxane, 1-dimethylamino-3-(dimethylsiloxy)-1,1,3,5,5-pentamethyltrisiloxane, 1-diethylamino-3-(dimethylsiloxy)-1,1,3,5,5-pentamethyltrisiloxane, 1-ethylmethylamino-3-(dimethylsiloxy)-1,1,3,5,5-pentamethyltrisiloxane, 1-di-iso-propylamino-3-(dimethylsiloxy)-1,1,3,5,5-pentamethyltrisiloxane, 3-dimethylamino-1,1,1,5,5,5-hexamethyltrisiloxane, 3-diethylamino-1,1,1,5,5,5-hexamethyltrisiloxane, 3-ethylmethylamino-1,1,1,5,5,5-hexamethyltrisiloxane, 3-di-iso-propylamino-1,1,1,3,5,5,5-hexamethyltrisiloxane, 3-dimethylamino-1,1,5,5-tetramethyltrisiloxane, 3-diethylamino-1,1,5,5-tetramethyltrisiloxane, 3-ethylmethylamino-1,1,5,5-tetramethyltrisiloxane, 3-di-iso-propylamino-1,1,5,5-tetramethyltrisiloxane, 1-dimethylamino-3,3-bis(dimethylsiloxy)-1,1,5,5-tetramethyltrisiloxane, 1-diethylamino-3,3-bis(dimethylsiloxy)-1,1,5,5-tetramethyltrisiloxane, 1-ethylmethylamino-3,3-bis(dimethylsiloxy)-1,1,5,5-tetramethyltrisiloxane, and 1-di-iso-propylamino-3,3-bis(dimethylsiloxy)-1,1,5,5-tetramethyltrisiloxane, 3-methylamino-1,1,1,3,5,5,5-heptamethyltrisiloxane, 3-ethylamino-1,1,1,3,5,5,5-heptamethyltrisiloxane, 3-iso-propylamino-1,1,1,3,5,5,5-heptamethyltrisiloxane, 3-tert-butylamino-1,1,1,3,5,5,5-heptamethyltrisiloxane, 3-methylamino-3-(trimethylsiloxy)-1,1,1,5,5,5-hexamethyltrisiloxane, 3-ethylamino-3-(trimethylsiloxy)-1,1,1,5,5,5-hexamethyltrisiloxane, 3-iso-propylamino-3-(trimethylsiloxy)-1,1,1,5,5,5-hexamethyltrisiloxane, 3-tert-butylmino-3-(trimethylsiloxy)-1,1,1,5,5,5-hexamethyltrisiloxane.

* * * * *